(12) United States Patent
Fuentes

(10) Patent No.: US 6,310,827 B1
(45) Date of Patent: Oct. 30, 2001

(54) ELECTRONIC MEMORY AND ELECTRONIC DEVICE PROVIDED WITH SUCH A MEMORY

(75) Inventor: Vincent Fuentes, Chez-le-Bart (CH)

(73) Assignee: EM Microelectronic-Marin SA, Marin (CH)

( * ) Notice: Subject to any disclaimer, the term of this patent is extended or adjusted under 35 U.S.C. 154(b) by 0 days.

(21) Appl. No.: 09/505,999

(22) Filed: Feb. 17, 2000

(30) Foreign Application Priority Data

Feb. 26, 1999 (EP) ..................................... 9913806

(51) Int. Cl.⁷ ....................................... G11C 8/00
(52) U.S. Cl. ...................... 365/239; 365/230.03
(58) Field of Search .............. 365/195, 230.03, 365/230.05, 239

(56) References Cited

U.S. PATENT DOCUMENTS 4,734,768 * 3/1988 Pexa ...................................... 358/135
5,724,551   3/1998 Greenstein et al. .................. 395/491

OTHER PUBLICATIONS

Patent Abstracts of Japan vol. 004 No. 146, Oct. 15, 1980 & JP 55 093595 (Hitachi Ltd), Jul. 16, 1980.

* cited by examiner

*Primary Examiner*—David Nelms
*Assistant Examiner*—Thong Le
(74) *Attorney, Agent, or Firm*—Griffin & Szipl, P.C.

(57) ABSTRACT

The electronic memory (2) includes blocks (M1 to MN) associated respectively with protective sequences (P1 to PN) and decision units (D1 to DN) which control access to the memory blocks.

The protective sequences include at least two bits. In order to protect the memory blocks against physical actions which could vary the inscribed code, access to a block is closed when the corresponding protective sequence has identical logical states.

6 Claims, 1 Drawing Sheet

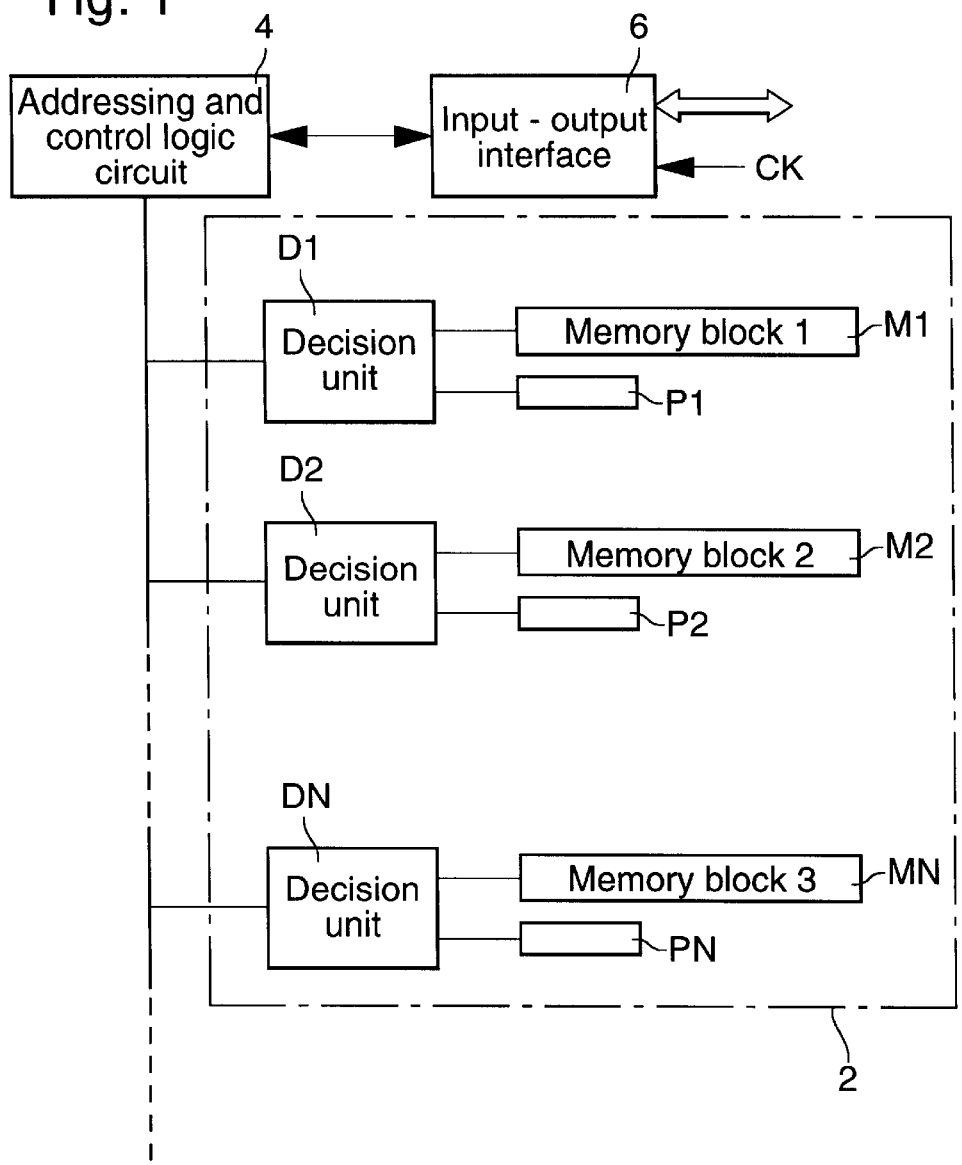

ELECTRONIC MEMORY AND ELECTRONIC DEVICE PROVIDED WITH SUCH A MEMORY

The present invention concerns an electronic memory and an electronic device provided with such a memory. In particular, the invention concerns the protection of data contained in an electronic memory and the control of access to such data or to the possibility of writing in the memory.

Generally speaking, the memory blocks or bit sequences forming a memory are protected, if required, by a protective or access bit. The level of protection provided by these protective bits is relatively average given that it is possible to alter their state by a physical action, in particular by an increase in temperature, ultraviolet radiation or other action generating the same result. It will be noted that these physical actions may be deliberate for the purpose of lifting the protection to have access to the memory data, either to read them, or to write other data in the memory. However, it should be noted that a memory may also be subjected to such aforementioned physical action by an unexpected variation in the conditions surrounding the memory, in particular as regards the increase in temperature.

An object of the present invention is to provide a memory fitted with protective means having a higher level of security. In particular, the object of the present invention is to overcome the reduction in protection which can result from physical action on the memory.

The present invention therefore concerns an electronic memory including at least one block associated with protective means for controlling access to data comprised in said block, this memory being characterised in that said protective means include a protective sequence of at least two bits and a decision unit which closes access to said block when the logic states of the bits of said sequence are identical.

As a result of these features any physical action on the memory and more particularly on the protective sequences generates a block on access to the protected data in the memory. The consequence of physical actions is generally to set all the bits subjected to the action to the same logic state, i.e. either the <<0>> logic state or the <<1>> logic state.

The present invention will be described in more detail hereinafter with reference to FIGS. 1 and 2 which are given by way of non limiting example, and in which.

FIG. 1 shows schematically an electronic device including an electronic memory according to the invention; and FIG. 2 gives the possible states for the protective sequence of each memory block and the type of access possible.

FIG. 1 shows an electronic device, including an electronic memory 2 and an electronic circuit including in particular an addressing and control logic circuit 4 for controlling access to various parts of memory 2. Logic circuit 4 is connected to a input/output interface for the data which is either intended to be read or to be entered into a part of memory 2, in particular into a memory block MN. The inpuvoutput interface is connected to peripheral electronic circuits and devices. Moreover, its clocked by means of a clock CK.

Electronic memory 2 is formed of a plurality of memory blocks M1, M2, MN. Each memory block is associated with a decision unit D1, respectively D2 . . . DN. The plurality of memory blocks M1, M2 . . . MN are respectively associated with a plurality of protective sequences P1, P2 . . . PN. It will be noted that the representation of each memory block associated with a decision unit and a protective sequence is entirely schematic and given solely by way of example. Any arrangement known to those skilled in the art and guaranteeing access to the memory block as a function of the code inscribed in the associated protective sequence can be provided without departing from the scope of the present invention. In particular, in a variant, the decision units D1 to DN form a single same integrated circuit in addressing and control circuit 4.

According to the invention, each protective sequence P1 to PN includes at least two bits, as is shown in FIG. 2 for sequence PN. Moreover, according to the invention, the codes of the protective sequence which allow access to the corresponding memory block MN include different logic states. Thus, in order to authorise reading and/or writing of the memory block, the protective code is formed by a first bit having a <<1>> logic state and a second bit having a <<0>> logic state. In order to authorise read only, the first bit of the protective code is at the <<0<< logic state whereas the second bit is at the <<1>> logic state. The two remaining codes, i.e. the two cases in which the logic states of the first and second bits of the protective sequences are either at <<1>> or at <<0>> do not authorise any access to memory block MN.

According to a particular embodiment, protective sequences P1 to PN are programmable. Thus, an authorised user or the manufacturer of the electronic memory can programme separately for each memory block either read only access, or read/write access. In order to do this, the electronic memory is electrically connected to an electronic programming circuit, which can form part of the electronic device provided with the electronic memory according to the invention. The programming of protective sequences P1 to PN is protected in particular by the entering of an access code.

In the event that this code is formed by a bit sequence, it is preferable, according to the present invention, that any access to the protective sequences is prohibited when the logic states of the access code are identical. The present invention is thus applied to a higher hierarchical level, the protective sequences defining programmable memory blocks to protect against physical action.

What is claimed is:

1. An electronic memory including at least one block of memory associated with protective means for controlling access to data comprised in said block of memory, wherein said protective means include a protective sequence of at least two bits and a decision unit which closes access to said block of memory when the logic states of the bits of said sequence are identical.

2. The electronic memory according to claim 1, wherein said protective sequence is capable of being programmed either for read only access or for read/write access.

3. The electronic memory according to claim 1, wherein said protective sequence is programmable.

4. An electronic device fitted with an electronic circuit and a electronic memory including at least one block of memory associated with protective means for controlling access to data comprised in said block, said protective means including a protective sequence of at least two bits, said protective means being programmable, and a decision unit which closes access to said block of memory when the logic states of the bits of said sequence are identical, and with an electronic circuit being arranged to allow an authorised user or a manufacturer to programme the progammable protective sequence, this operation being protected by specific protective means.

5. The electronic device according to claim 4, wherein said electronic memory includes a plurality of blocks of memory associated respectively with a plurality of protective sequences.

6. The electronic device according to claim 5, wherein said specific protective means are also formed by a sequence of bits defining an access code to the protective sequences, any access to said protective sequences being prohibited when the logic states of said access code are identical.

* * * * *